(12) United States Patent
Huang et al.

(10) Patent No.: US 7,678,614 B2
(45) Date of Patent: Mar. 16, 2010

(54) THERMAL INTERFACE MATERIAL AND METHOD FOR MAKING THE SAME

(75) Inventors: Hua Huang, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 972 days.

(21) Appl. No.: 11/321,140

(22) Filed: Dec. 29, 2005

(65) Prior Publication Data

US 2006/0219689 A1    Oct. 5, 2006

(30) Foreign Application Priority Data

Mar. 31, 2005    (CN) .................. 2005 1 0033937

(51) Int. Cl.
*H01L 21/00* (2006.01)
(52) U.S. Cl. .................... 438/122; 257/E21.101; 257/E23.105; 257/E23.107; 257/E23.111
(58) Field of Classification Search ............... None
See application file for complete search history.

(56) References Cited

U.S. PATENT DOCUMENTS

| | | | | |
|---|---|---|---|---|
| 6,283,812 | B1* | 9/2001 | Jin et al. ...................... | 445/24 |
| 6,924,335 | B2 | 8/2005 | Fan et al. | |
| 2004/0118579 | A1* | 6/2004 | McCutcheon et al. ...... | 174/16.3 |
| 2005/0136248 | A1* | 6/2005 | Leu et al. ................... | 428/332 |
| 2006/0112857 | A1* | 6/2006 | Hougham et al. ........... | 106/472 |

FOREIGN PATENT DOCUMENTS

| | | |
|---|---|---|
| CN | 1501483 A | 6/2004 |
| CN | 1512933 A | 7/2004 |
| EP | 1329953 A1 | 7/2003 |
| JP | 11-17369 A | 1/1999 |
| JP | 11-302545 A | 11/1999 |
| JP | 2001-353736 A | 12/2001 |

(Continued)

OTHER PUBLICATIONS

Brigitte Vigolo et al. "Macroscopic Fibers and Ribbons of Oriented Carbon Nanotubes" Science, Nov. 17, 2000, p. 1331-1334, vol. 290.

*Primary Examiner*—Sue Purvis
*Assistant Examiner*—Leslie Pilar Cruz
(74) *Attorney, Agent, or Firm*—D. Austin Bonderer

(57) ABSTRACT

A thermal interface material (100) includes a macromolecular matrix (10) and a plurality of thermally conductive fibers (20) incorporated therein. The macromolecular matrix (10) has a first surface (11) and an opposite second surface (12). Each of the thermally conductive fibers (20) is substantially parallel to each other and extends between the first and second surfaces (11), (12). A method for manufacturing the thermal interface material includes the steps of: (a) providing a number of thermally conductive fibers; (b) aligning the thermally conductive fibers uniformly and directionally to form an array of the thermally conductive fibers; (c) immersing the array of thermally conductive fibers into a liquid macromolecular material; (d) solidifying the liquid macromolecular material to obtain a macromolecular matrix having the two opposite surfaces with the thermally conductive fibers embedded therein, that is, a desired interface material is obtained.

14 Claims, 3 Drawing Sheets

FOREIGN PATENT DOCUMENTS

| | | | |
|---|---|---|---|
| JP | 2002-146672 A | | 5/2002 |
| JP | 2003-174127 A | | 6/2003 |
| JP | 2003174127 A | * | 6/2003 |
| JP | 2003-249613 A | | 9/2003 |
| JP | 2003-303930 A | | 10/2003 |
| JP | 2004-161996 A | | 6/2004 |
| TW | 200404868 | | 4/2004 |
| TW | 200406443 | | 5/2004 |
| TW | 200427961 | | 12/2004 |

* cited by examiner

THERMAL INTERFACE MATERIAL AND METHOD FOR MAKING THE SAME

CROSS-REFERENCE TO RELATED APPLICATIONS

This application is related to three corresponding U.S. patent applications each entitled "THERMAL INTERFACE MATERIAL AND METHOD FOR MANUFACTURING SAME" with application Ser. No. 11/024,513, filed on Dec. 28, 2004, and "THERMAL INTERFACE MATERIAL AND METHOD FOR MANUFACTURING SAME" with application Ser. No. 11/089,864, filed on Mar. 25, 2005, and "THERMAL INTERFACE MATERIAL AND METHOD FOR MANUFACTURING SAME" with application Ser. No. 10/991,022, filed on Nov. 17, 2005, each having the same assignee as the instant application. The disclosures of the above-identified applications are incorporated herein by reference.

BACKGROUND

1. Technical Field

The invention relates generally to thermal interface materials and making methods thereof; and more particularly to a kind of thermal interface material which enhances contact between a heat source and a heat dissipating device, and a method for making the same.

2. Discussion of the Related Art

Electronic components such as semiconductor chips are becoming progressively smaller, while at the same time heat dissipation requirements thereof are increasing. Commonly, a thermal interface material is utilized between the electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

A new thermal interface material which overcomes the above-mentioned problems and a method for making such material are desired.

SUMMARY

An embodiment of a thermal interface material includes a macromolecular material matrix and a number of thermally conductive fibers embedded in the macromolecular matrix uniformly. The macromolecular matrix has a first surface and an opposite second surface. The thermally conductive fibers are substantially parallel to each other, and extend from the first surface to the second surface.

A method for making the above mentioned thermal interface material comprises the steps of:

(a) providing a number of thermally conductive fibers;

(b) aligning the thermally conductive fibers uniformly and directionally to form an array of the thermally conductive fibers;

(c) immersing the array of thermally conductive fibers into a liquid macromolecular material;

(d) solidifying the liquid macromolecular material to obtain a macromolecular matrix having two opposite surfaces with the thermally conductive fibers embedded therein, the thermally conductive fibers extending from one surface to another opposite surface.

DETAILED DESCRIPTION

Figure 6:
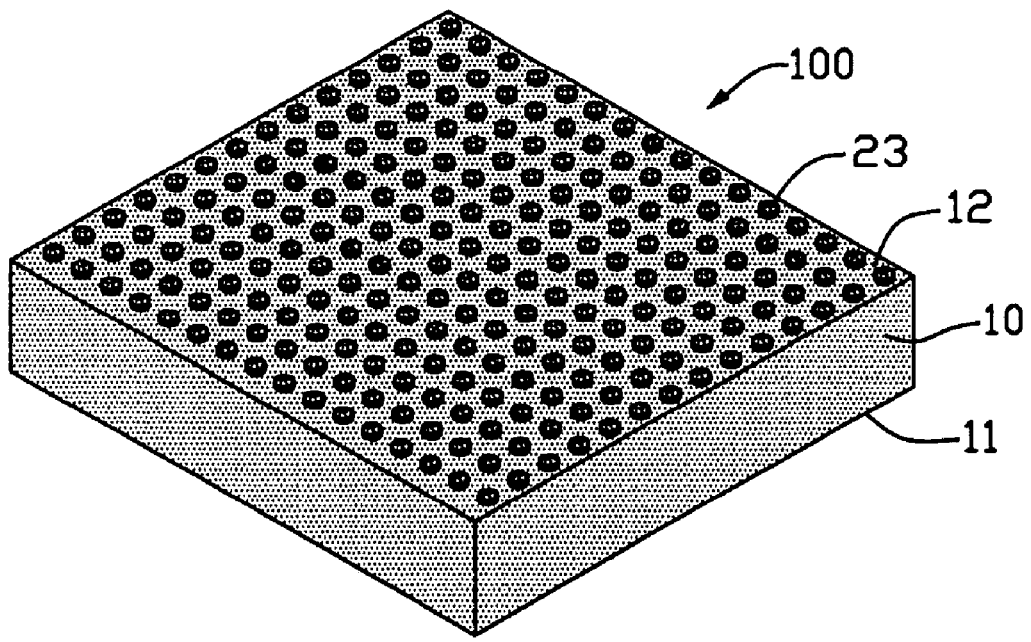
FIG. 6 is a schematic view of a piece of thermal interface material.

Referring to FIG. 6, a thermal interface material 100 includes a macromolecular matrix 10 and a number of thermally conductive fibers 20 incorporated therein directionally and uniformly. The macromolecular matrix 10 includes a first surface 11 and an opposite second surface 12. Preferably, the first surface 11 is substantially parallel to the second surface 12. The thermally conductive fibers 20 are substantially parallel to each other, and extend from the first 11 to the second surface 12. Preferably, the thermally conductive fibers 20 are substantially perpendicular to the first and second surfaces 11, 12.

Figure 1:
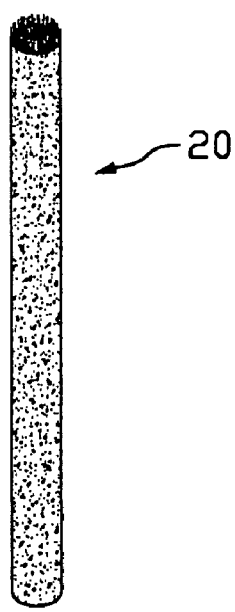
FIG. 1 is a schematic view of a piece of carbon nanotube/macromolecular material composite fiber, in accordance with a preferred embodiment.
Figure 2:
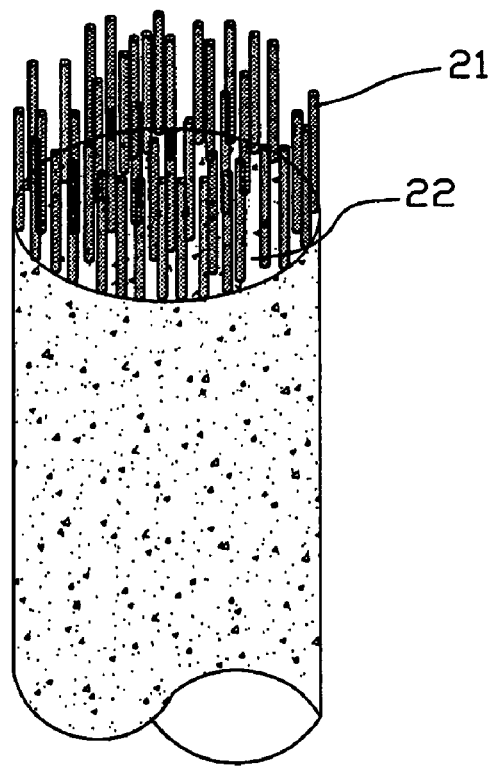
FIG. 2 is an enlarged, schematic view of FIG. 1.

Referring to FIG. 1 and FIG. 2, the thermally conductive fibers 20 may be a composite fiber selected from the group comprised of a carbon nanotube/macromolecular material composite fiber, a metal/macromolecular composite fiber, a ceramics/macromolecular composite fiber and a carbon fiber. The carbon nanotube/macromolecular material composite fiber 20 may be made of carbon nanotubes 21 and macromolecular material 22. The metal being used in the metal/macromolecular composite fiber includes copper (Cu), aluminum (Al), silver (Ag) and so on. The ceramics being used in the ceramics/macromolecular composite fiber includes aluminum oxide ($Al_2O_3$), zinc oxide (ZnO) and so on. A diameter of the thermally conductive fiber 20 is in the range from 100 nanometers to 100 micrometers. The macromolecular material 22 may be phase change material, resin material, thermally conductive grease, or composites of such materials. The resin material includes epoxy resin, acrylic resin, silicon resin and so on.

A method for making the thermal interface material 100 includes the steps of:

(a) providing a number of thermally conductive fibers 20;

(b) aligning the thermally conductive fibers 20 uniformly and directionally to form an array of the thermally conductive fibers 23;

(c) immersing the array of thermally conductive fibers 23 into a liquid macromolecular material 13;

(d) solidifying the liquid macromolecular material 13 to obtain a macromolecular matrix 10 having two opposite surfaces 11, 12 with the array of the thermally conductive fibers 23 embedded therein, the thermal conductive fibers 20 are extending from one of the surfaces 11/12 to the other surfaces 12/11.

Step (a), providing a number of thermally conductive fibers. For example, the thermally conductive fibers 20 are comprised of carbon nanotube/polymer composite fibers. An exemplary method for synthesizing carbon nanotube/polymer composite fiber 20 may be spinning method. The spinning method includes the steps of: firstly, dropping about 0.2 ml of a polyurethane solution into a beaker filled with about 20 ml of an acetic acid ethyl ester ($CH_3COOC_2H_5$) solution; secondly, adding about 2 mg of carbon nanotubes to the beaker to obtain a mixture, and distributing the mixture for about 5 minutes in an ultrasonic processor; thirdly, dropping about 0.2~0.3 ml of the mixture into a dish filled with de-ionized water with a temperature being about 30° C.; fourthly, after bout 20 seconds, dipping a surface of the mixture and reeling out a piece of carbon nanotube/acetic acid ethyl ester composite fiber. A diameter of the carbon nanotube/acetic acid ethyl ester composite fiber is about 1 micrometer. In addition, carbon nanotube/acetic acid ethyl ester composite fibers with various concentration of the carbon nanotubes may be obtained employing control the concentration of the carbon nanotubes or the acetic acid ethyl ester solution in the mixture.

The carbon nanotubes for manufacturing the carbon nanotube/polymer composite fibers 20 by spinning method may be irregularly arrayed. Nowadays, the irregularly arraying carbon nanotubes can be mass produced, a producing speed can reach 15 kilogram per hour. In addition, a price of the irregularly arraying carbon nanotubes is less than 1.25 kilogram per dollar, that is, the price is very low. Therefore, the cost of manufacturing the carbon nanotube/polymer composite fibers 20 by spinning method is relatively low. Also, the carbon nanotubes both have excellent heat conductive and mechanical properties at room temperature, so the heat conductive and mechanical properties of the carbon nanotube/polymer composite fibers 20 are excellent correspondingly.

Alternatively, the carbon nanotube/acetic acid ethyl ester composite fiber may be synthesized by another method. The method includes the steps of: first, preparing an array of carbon nanotubes on a substrate 30 employing chemical vapor deposition method.

Second, selecting a segment of array of carbon nanotubes and pulling out a piece of carbon nanotube yarn by an appropriate strength. Detail of the method for pulling out the carbon nanotube yarn can be found in page 801, Vol. 412, Nature 2002. A diameter of the carbon nanotube/acetic acid ethyl ester composite fiber is about 1 micrometer. One piece of the carbon nanotube yarn is comprised of a bundle of carbon nanotubes. Such carbon nanotubes are substantially parallel to each other and uniform in length. The pulling strength is predetermined by the width of the desired carbon nanotube yarn. The wider the desired carbon nanotube yarn may be, the larger the pulling strength may be. The length of the carbon nanotube yarn obtained by this method may be over 30 centimeters. The width of the carbon nanotube yarn obtained by this method may be over 200 micrometers.

Third, immersing the carbon nanotube yarn into the acetic acid ethyl ester solution to obtain a piece of carbon nanotube/acetic acid ethyl ester composite fiber. The diameter of the carbon nanotube/acetic acid ethyl ester composite fiber is in the range from about 100 nanometers to about 100 micrometers. In addition, a desired length of the thermally conductive fibers 20 may be gained by cutting them with a flock cutting machine.

In the above carbon nanotube/acetic acid ethyl ester composite fibers, the length of the carbon nanotube yarn can be over 30 centimeters, and the width can be in the range from 100 nanometers to 100 micrometers, so this carbon nanotube yarn can provide a more excellent mechanical property. In addition, the carbon nanotubes in the carbon nanotube yarn are aligned directionally and uniformly, so the heat conductive property of this carbon nanotube yarn may be more excellent. Therefore, the carbon nanotube/acetic acid ethyl ester composite fibers comprised of the carbon nanotube yarns can provide a more remarkable heat conductive and mechanical properties correspondingly.

Figure 3:
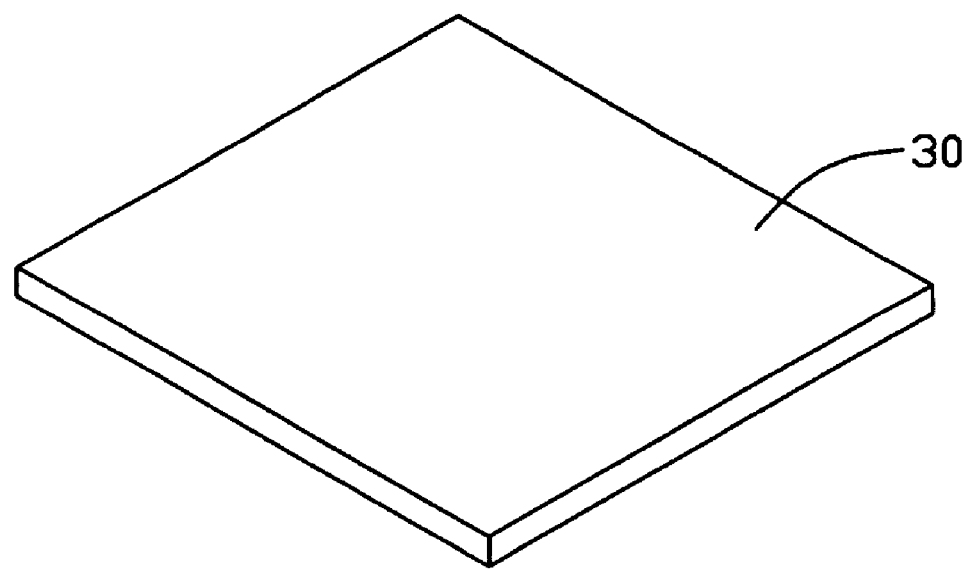
FIG. 3 is a schematic view of a substrate.
Figure 4:
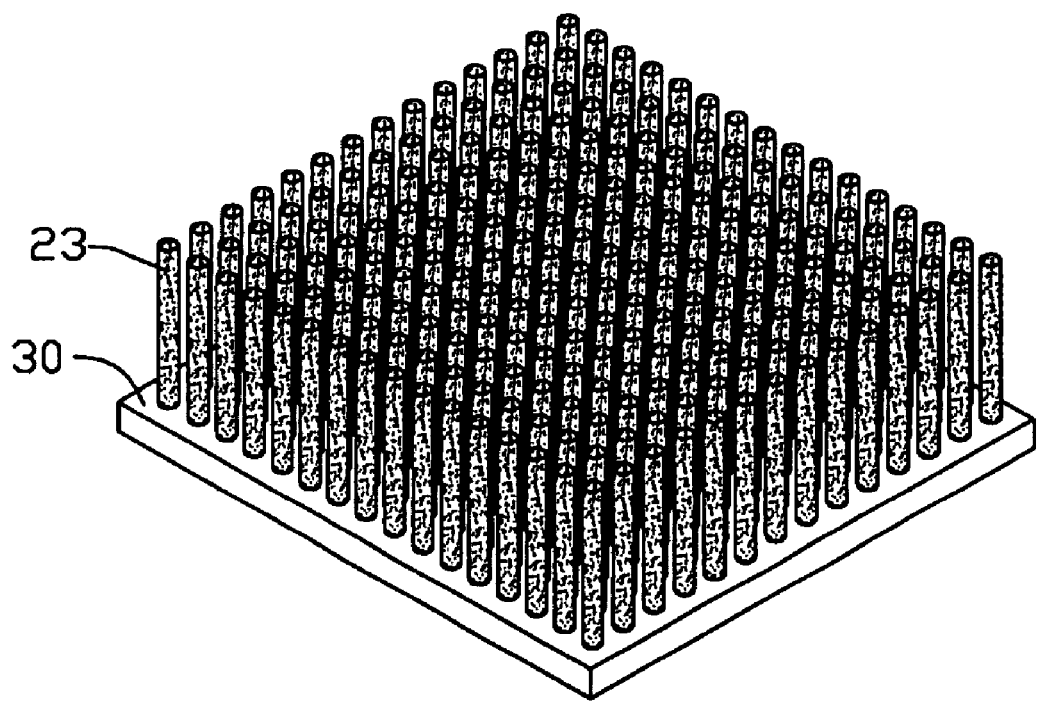
FIG. 4 is similar to FIG. 3, but showing a number of carbon nanotube/macromolecular material composite fibers formed on the substrate.

Step (b), aligning the thermally conductive fibers 20 uniformly and directionally to form an array of the thermally conductive fibers 23. Referring to FIG. 3, a substrate 30 is illustrated. The substrate 30 is made from an electrically conductive material such as metal. An adhesive or tacky material is coated on the substrate 30. FIG. 4 shows an array of the thermally conductive fibers 23 directionally formed on the substrate 30. The thermally conductive fibers 20 comprised of the array of the thermally conductive fibers 23 are substantially parallel to each other. Generally, long fibers with length about 30 centimeters or above are arrayed directionally and uniformly employing a winding method. For example, winding the long fibers around a clava to form the array of the thermally conductive fibers.

Fibers with length less than 30 centimeters may be cut into short fibers with length about 20 millimeters or below to form an array. There are several methods for aligning short fibers to form the array, such as flocking method, mechanical carding method, manual carding method, and so on. For example, the flocking method includes electrostatic flocking method, mechanical flocking method, and pneumatic flocking method. Different flocking methods may be used alone, or in combination with one another, e.g., pneumatic/electrostatic flocking.

Electrostatic flocking is a well-known method. In this method, an electric field is first formed between two opposite electrodes having opposite charge. The electric field is for example 7 kilovolts or above. The substrate 30 may be used as one of the electrodes or coated on one of the electrodes. The fibers are put in the field and absorb the corresponding charge of one electrode and are attracted by the opposite electrode. They embedded in the adhesive when they hit the opposite electrode with the substrate 30. If they do not stick initially, the thermally conductive fibers 20 bounce back and forth between the two electrodes until they become embedded in the adhesive. Then the electric field is removed. The thermally conductive fibers 20 that result aligned according to the electric field lines, that is, the aligned fibers are substantially parallel to each other and substantially perpendicular to the two electrodes.

In mechanical flocking, the substrate 30 is deposited over a series of rapidly rotating rollers or beater bars, which cause the substrate 30 vibrate. The thermally conductive fibers 20 are fed onto the substrate 30 under gravitation effect from a hopper. The vibrations produced by the rollers or beater bars orient thermally conductive fibers 20 and drive them into the adhesive. Excess thermally conductive fibers 20 are removed, leaving thermally conductive fibers 20 with substantially perpendicular to the substrate 30.

Pneumatic flocking uses an airstream to deliver the thermally conductive fibers 20 to the substrate 30. While in a flight, the thermally conductive fibers 20 align themselves along a direction of the airflow and embedded in the adhesive in an oriented manner.

Besides the flocking methods, the short fibers can be directionally and uniformly formed on the substrate 30 by carding method. That is, dispersing the short fibers on the substrate 30, then carding the short fibers directionally and uniformly on the substrate 30 by mechanical carding method or manual carding method. Because the carbon nanotube/acetic acid ethyl ester composite fibers have remarkable mechanical property, an excellent array of the carbon nanotube/acetic acid ethyl ester composite fibers may be obtained by the mechanical carding method or manual carding method.

Figure 5:
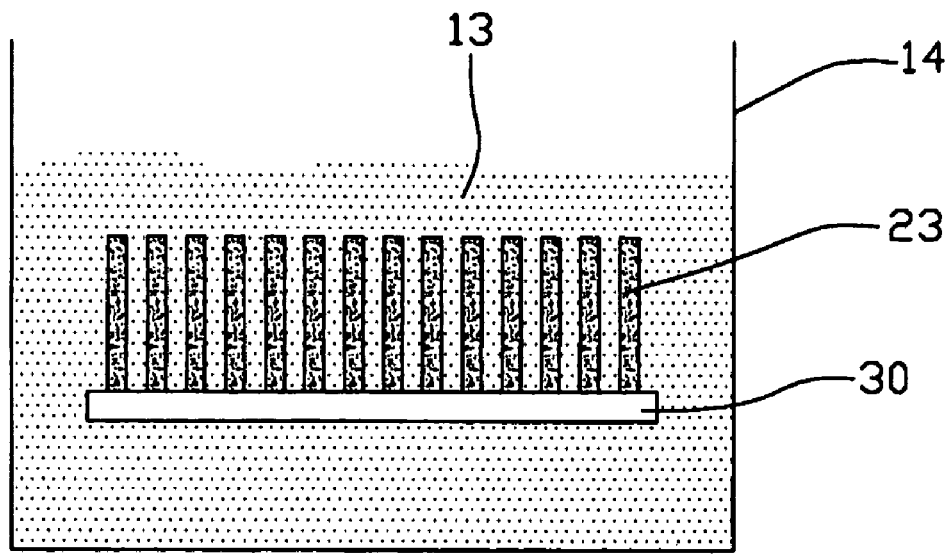
FIG. 5 is a schematic side view of FIG. 4, but showing the substrate having carbon nanotube/macromolecular material composite fibers being immersed into a macromolecular matrix.

Step (c), immersing the array of thermally conductive fibers 23 into a liquid macromolecular material 13. Referring to FIG. 5, the array of thermally conductive fibers 23 with the substrate 30 is immersed into a container 14 of liquid macromolecular material 13. As a result, the liquid macromolecular material 13 infuses into the array of thermally conductive fibers 23. The liquid macromolecular material 13 is selected from the group consisting of a melted macromolecular solution, and a monomer solution of polymer. In a preferred embodiment, the liquid macromolecular material 13 is liquid paraffin.

Step (d), solidifying the liquid macromolecular material 13 to obtain a macromolecular matrix 10 having two opposite surfaces 11, 12 with the array of the thermally conductive fibers 23 embedded therein, the thermal fibers 20 are extending from one of the surfaces 11/12 to the other surfaces 12/11. The liquid macromolecular material 13 is cooled and solidified thereby forming the macromolecular matrix 10 having a first surface 11 and an opposite second surface 12, the array of the thermally conductive fibers 23 being directionally and uniformly embedded in the macromolecular matrix 10. Then the macromolecular matrix 10 with the substrate 30 may be taken out of the container 14. Because of the obtained macromolecular matrix 10 with the array of the thermally conductive fibers 23 embedded therein being formed on the substrate 30, a further step needed to peel the macromolecular matrix 10 with the array of the thermally conductive fibers 23 embedded therein off from the substrate 30, thus thermal interface material 100 is formed, as shown in FIG. 6.

In order to obtain a piece of thermal interface material having predetermined thickness, the thermal interface material 100 can be cut in a direction perpendicular to the length of the thermally conductive fibers 20 employing microtome technology in biomedicine. There, the piece of desired thermal interface material with desired thickness is formed.

What is claimed is:

1. A method for manufacturing a thermal interface material, the method comprising the steps of:
   providing a plurality of thermally conductive fibers synthesized using polymer and thermally conductive materials;
   aligning the thermally conductive fibers uniformly and directionally to form an array of the thermally conductive fibers;
   immersing the array of thermally conductive fibers into a liquid macromolecular material; and
   solidifying the liquid macromolecular material to obtain a macromolecular matrix having two opposite surfaces with the thermally conductive fibers embedded therein, the thermally conductive fibers extending from one surface to another opposite surface;
   wherein the thermally conductive fiber is a carbon nanotube and polymer composite fiber and a method for synthesizing the carbon nanotube and polymer composite fiber comprises:
   supplying a polyurethane solution into a container filled with an acetic acid ethyl ester solution;
   adding carbon nanotubes to the container to obtain a mixture, and distributing the mixture in an ultrasonic processor;
   placing the mixture into a dish filled with de-ionized water; and obtaining a piece of carbon nanotube/acetic acid ethyl ester composite fiber from a surface of the mixture.

2. A method for manufacturing a thermal interface material, the method comprising the steps of:
   providing a plurality of thermally conductive fibers synthesized using polymer and thermally conductive materials;
   aligning the thermally conductive fibers uniformly and directionally to form an array of the thermally conductive fibers;
   immersing the array of thermally conductive fibers into a liquid macromolecular material; and
   solidifying the liquid macromolecular material to obtain a macromolecular matrix having two opposite surfaces with the thermally conductive fibers embedded therein, the thermally conductive fibers extending from one surface to another opposite surface;
   wherein a method of aligning the thermally conductive fibers comprises:
   providing a substrate;
   feeding the thermally conductive fibers onto the substrate;
   vibrating the substrate having the thermally conductive fibers; and
   removing excess thermally conductive fibers that are not substantially perpendicular to the substrate.

3. The method as claimed in claim 2, wherein the method further comprising a step of cutting the macromolecular matrix with the array of the thermally conductive fibers embedded therein in a direction of perpendicular to a length of the array of thermally conductive fibers employing microtome technology in biomedicine.

4. The method as claimed in claim 2, wherein a diameter of the array of thermally conductive fibers is in the range from 100 nanometers to 100 micrometers.

5. The method as claimed in claim 2, wherein the array of thermally conductive fibers are substantially parallel to each other.

6. The method as claimed in claim 2, further comprising a step of peeling the macromolecular matrix, with the array of fibers embedded therein, off from a substrate to form the thermal interface material; wherein the peeling the macromolecular matrix off from the substrate is done after solidifying the liquid macromolecular material to obtain a macromolecular matrix with the array of fibers embedded therein.

7. The method as claimed in claim 2, wherein the two opposite surfaces are substantially parallel to each other.

8. The method as claimed in claim 7, wherein the array of thermally conductive fibers are substantially perpendicular to the first and second surfaces.

9. The method as claimed in claim 2, wherein the array of thermally conductive fibers is a composite fiber selected from the group comprised of a carbon nanotube/macromolecular material composite fiber, a metal/polymer composite fiber, a ceramics/polymer composite fiber and a carbon fiber.

10. The method as claimed in claim 9, wherein the macromolecular material is selected from the group consisting of a phase change material, a resin material, a thermally conductive grease, and mixtures of such materials.

11. The method as claimed in claim 9, wherein a metal used in the metal/polymer composite fiber is selected from the group consisting of Cu, Al and Ag.

12. The method as claimed in claim 9, wherein a ceramics used in the ceramics/polymer composite fiber is one of aluminum oxide and zinc oxide.

13. The method as claimed in claim 9, wherein the carbon nanotube/macromolecular material composite fiber comprises of a carbon nanotube and polymer composite fiber, and a method for synthesizing the carbon nanotube and polymer composite fiber comprises:

supplying a polyurethane solution into a container filled with an acetic acid ethyl ester solution;

adding carbon nanotubes to the container to obtain a mixture, and distributing the mixture in an ultrasonic processor;

placing the mixture into a dish filled with de-ionized water; and obtaining a piece of carbon nanotube/acetic acid ethyl ester composite fiber from a surface of the mixture.

14. The method as claimed in claim 9, wherein the carbon nanotube/macromolecular material composite fiber comprises of a carbon nanotube/acetic acid ethyl ester composite fiber, and a method for synthesizing the carbon nanotube/acetic acid ethyl ester composite fiber comprises:

preparing an array of carbon nanotubes on a substrate employing chemical vapor deposition;

pulling out a piece of carbon nanotube yarn by an appropriate strength; and immersing the carbon nanotube yarn into the acetic acid ethyl ester solution.

* * * * *